(12) United States Patent
Pluymers et al.

(10) Patent No.: US 7,823,866 B1
(45) Date of Patent: Nov. 2, 2010

(54) DISTRIBUTED LOAD EDGE CLAMP

(75) Inventors: Brian A. Pluymers, Haddonfield, NJ (US); Khanh Nguyen, Conshohocken, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 447 days.

(21) Appl. No.: 11/864,033

(22) Filed: Sep. 28, 2007

(51) Int. Cl.
   *B25B 1/06* (2006.01)
(52) U.S. Cl. .................. 269/254 CS; 269/903; 29/428
(58) Field of Classification Search ........... 269/254 CS, 269/71, 229, 903, 901; 29/281.1, 428
   See application file for complete search history.

(56) References Cited

U.S. PATENT DOCUMENTS

| | | | |
|---|---|---|---|
| 5,013,997 A | 5/1991 | Reese | |
| 5,459,474 A | 10/1995 | Mattioli et al. | |
| 6,316,719 B1 | 11/2001 | Pluymers et al. | |
| 6,388,317 B1 | 5/2002 | Reese | |
| 6,469,671 B1 | 10/2002 | Pluymers et al. | |
| 6,953,188 B2 * | 10/2005 | Siegel | 269/266 |
| 7,144,003 B1 * | 12/2006 | Meade | 269/43 |
| 7,272,880 B1 * | 9/2007 | Pluymers et al. | 29/428 |

OTHER PUBLICATIONS

U.S. Appl. No. 10/640,445, filed Aug. 13, 2003, in the name of Pluymers, Brian A.

* cited by examiner

*Primary Examiner*—Lee D Wilson
(74) *Attorney, Agent, or Firm*—Duane Morris LLP

(57) ABSTRACT

An arrangement for clamping a flat plate to a flat surface includes juxtaposing the plate to the flat surface. An axially-movable wedging element defining a surface fitted with wedges is fixed against motion in other than a direction of elongation, and is forced to move in the direction of elongation. The wedges are forced against a first spring beam to impart forces thereto. The forces are coupled from the first spring beam to a second spring beam by intermediary supports. The second spring beam bears against a surface of the flat plate to force the plate against the flat surface.

4 Claims, 9 Drawing Sheets

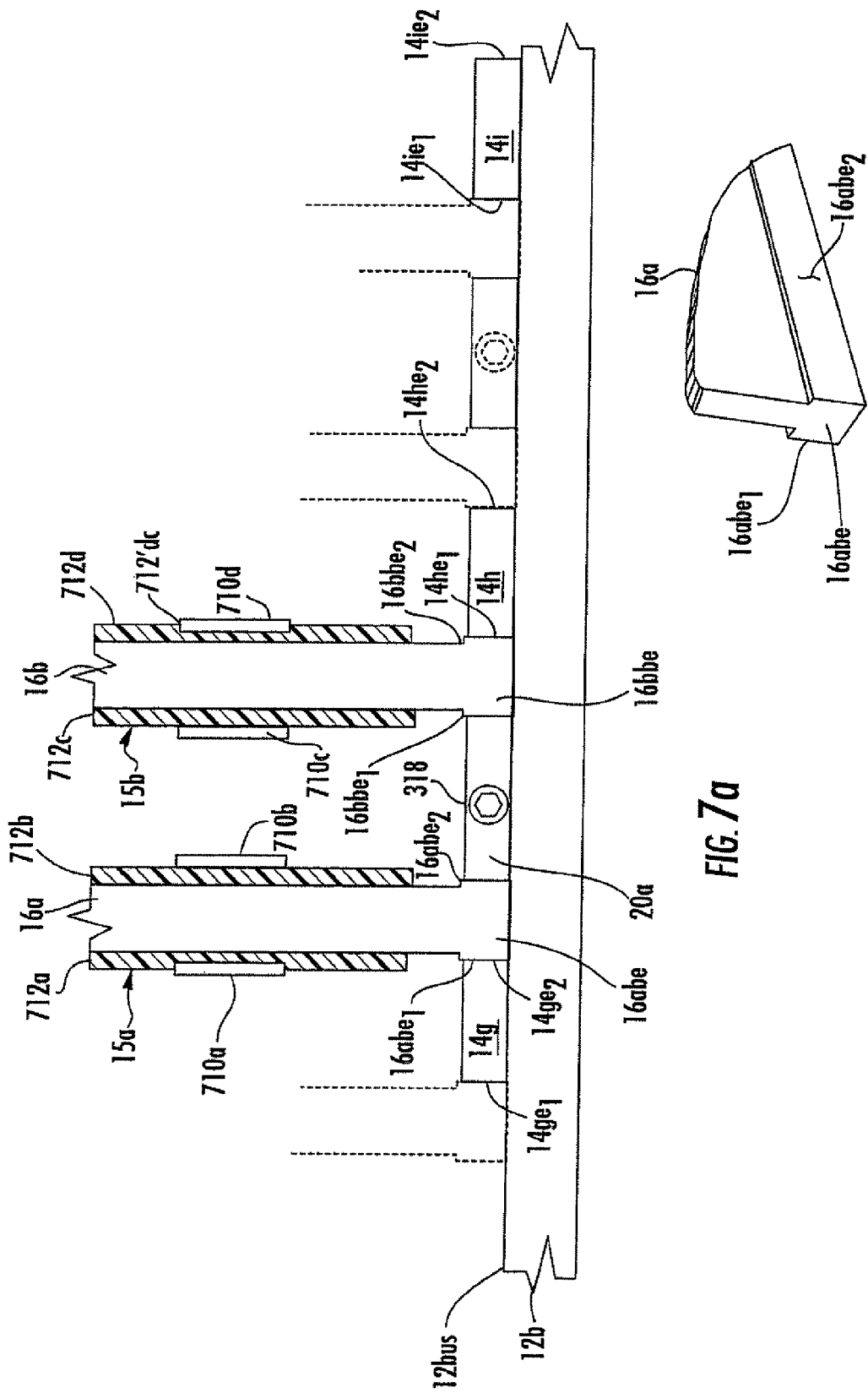

DISTRIBUTED LOAD EDGE CLAMP

GOVERNMENTAL INTEREST

This invention was made with government support under Contract/Grant N00024-99-9-5386 (NTW Radar). The United States Government has a non-exclusive, non-transferable, paid-up license in this invention.

RELATED APPLICATIONS

This application is related to U.S. application Ser. No. 10/854,976, filed May 27, 2004, now U.S. Pat. No. 7,272,880 issued on Sep. 25, 2007, the entire disclosure of which is incorporated herein by reference.

FIELD OF THE INVENTION

This invention relates to provision of even clamping pressure between flat objects, and more particularly to providing such even pressure between a heat-generating item and a heat sink or cold plate.

BACKGROUND OF THE INVENTION

Temperature is a well-known cause of degraded performance and/or failure in electronic devices. When vacuum tubes were in widespread use, the heat generate by such devices as color television receivers tended to raise internal temperatures to the point that various electronic elements such as resistors would "cook" and change value, and sockets for the vacuum tubes, if made from organic material such as phenolic, would char and in some cases disintegrate.

With the advent of semiconductors and other solid-state devices, the amount of heat produced by an electronic device tended to be less than in vacuum-tube equipment. However, while the amount of heat produced by a solid-state apparatus may be less per device than in a vacuum-tube apparatus, the number of solid-state devices, and their packing density, can be so great that temperature-related problems are exacerbated.

Various methods have been used to control the temperature of solid-state devices. In any situation in which undesired heat is produced by a device, the heat must be taken away by a low-thermal-resistance path. Since heat flows from a region at a given temperature only to a region at a lower temperature, the number of options for temperature abatement are limited. When discrete packaged semiconductors were in widespread use, a thermally conductive, large-surface-area "heat sink" could be attached to the case of the semiconductor to increase the effective surface area of the case in order to provide a low-thermal-resistance path from the high temperature semiconductor to lower-temperature ambient air. The art of "heat sinks" became elaborate, especially as applied to cased microcircuits such as microprocessors.

Another technique for helping to control the maximum temperature of semiconductors in a heat-producing circuit is to connect a flat portion of the case of the circuit by means of a thermally conductive path to a thermally conductive "cold plate." Those skilled in the art know that a "cold plate" is not necessarily cold to the touch, and needs only to be cold relative to the item to be cooled. One such arrangement with a cold plate is described in U.S. Pat. No. 6,316,719, issued Nov. 13, 2001 in the name of Pluymers et al. Ideally, a single such circuit is to be temperature controlled, and the broad side of the circuit plate can be affixed to the cold plate, as by screws or adhesive.

In some cases, it is necessary to provide a relatively large number of heat-producing circuits within a defined region. Such a situation occurs in the case of active array antennas, where the operating frequency and antenna beam characteristics tend to determine the inter-circuit spacing of the associated active circuits. In some cases, the active circuits may be only low-noise amplifiers. In such cases, the heat density of the array of active elements may be relatively low. When, however, the active circuits include transmitter functions, as in the case of an active array antenna for a radar system, a large amount of heat may be generated within each active circuit, and the active circuits may be in close proximity. Perfect solutions to temperature control of the active circuits under such conditions have not been found.

One solution to the problems of temperature control in the high packing density, radar active array context is described in U.S. Pat. No. 6,469,671, issued Oct. 22, 2002 in the name of Pluymers et al. In this arrangement, a plurality of transmit-receive modules are arrayed on each of a plurality of generally planar heat-conducting baseplates of a line-replaceable unit. The heat-producing modules are mounted along an edge of the baseplates facing the antenna array. This arrangement is effective, but may be costly, and some embodiments may undesirably not have all the electronic devices on the line-replaceable unit, but on the underlying frame.

Another way to cool solid-state devices is by use of a coolant fluid which transfers heat by convection to a heat sink. Such a scheme is described in U.S. Pat. No. 5,013,997, issued May 7, 1991 in the name of Reese. This arrangement has the advantage of reducing stress on the heated element, but may not be useful in the case of line replaceable units. Another scheme for the use of a coolant fluid is described in U.S. Pat. No. 5,459,474, issued Oct. 17, 1995 in the name of Mattioli et al. In this arrangement, the electronic modules associated with the elements of an array antenna are mounted behind the array on slide-in carriers, so the electronic modules can be exposed. The electronic modules transfer heat by a thermally conductive path to a cold plate, and a flow of coolant fluid transfers heat away from a cold plate. This arrangement is effective in maintaining the cold plate temperature, but does not improve the transfer of heat from the heat-producing modules to the cold plate. The fluid connections may be difficult to connect and disconnect, and may leak under some conditions. U.S. patent application Ser. No. 10/640,445, filed Aug. 13, 2003 in the name of Pluymers, which is still pending, describes a coolant fluid quick-connect arrangement which tends to reduce spillage under certain conditions.

An arrangement is described in U.S. Pat. No. 6,388,317, issued May 14, 2002 in the name of Reese, in which a flow of coolant is provided to support elements immediately underlying the solid-state chip which is the source of heat. This arrangement is very effective in heat transfer, but requires a fluid path for each chip, which in turn requires plumbing for each chip, and may be expensive. The fluid paths, if numerous, provide many locations at which leakage can occur.

Improved or alternative temperature control arrangements are desired.

SUMMARY OF THE INVENTION

A method according to another aspect of the invention is for clamping a generally planar object to a planar surface. The method includes juxtaposing the planar object to the planar surface. An elongated wedging element including a plurality of wedges along its length is fixed against motion in directions other than the direction of elongation of the wedging element, and is forced to move axially in the direction of elongation. Each of the wedges bears against a corresponding first spring beam in a direction orthogonal to the direction of elongation in response to the axial motion in the direction of elongation of the wedging element, to thereby impart force to the first spring beam. The forces imparted to the first spring beam are coupled by intermediary supports to a second spring beam, and from the second spring beam to the generally planar object to force the generally planar object into contact with the planar surface.

A method for extracting heat from a replaceable module including a plate having a straight exposed edge region according to an aspect of the invention comprises the step of placing a first side of the edge region adjacent a surface of a fixed, generally planar cold plate. A clamping element elongated in a direction of elongation is placed between a second side of the edge region and a generally straight fixed object. The clamping element includes an elongated spring element having protrusions spaced apart by a pitch distance, and also includes an elongated wedging element including a plurality of individual wedges, also spaced apart by about the pitch distance. Each of the individual wedges is adjacent to at least one of the protrusions. The method includes moving the elongated wedging element in a direction parallel to the direction of elongation in such a manner as to cause a wedge surface of each of the wedges to move in a direction toward its associated protrusions, whereby force is applied to force the spring element toward the second edge portion of the plate, and the first edge portion of the plate is forced against the generally flat surface of the fixed, generally planar cold plate.

An edge clamp according to an aspect of the invention is for clamping an elongated edge of a first flat plate to a fixed flat structure. The edge clamp comprises an elongated first spring element including first and second generally mutually parallel spring plates. The first and second spring plates are elongated in a first direction, namely the direction of elongation of the elongated edge of the first flat plate. The first and second spring plates are mechanically interconnected by a plurality of spaced-apart supports extending in a second direction generally orthogonal to the direction of elongation of the first and second spring plates, to define between the supports a plurality of unsupported regions in which the first and second spring plates are not interconnected, and to also define external surfaces of the first and second spring plates on those sides of the first and second spring plates remote from the supports. The first spring plate defines at least a first, and preferably a second, externally-directed projection from the external surface of the first spring plate in regions overlying at least some of the unsupported regions, and the second spring plate defines at least a first externally-directed projection from the external surface of the second spring plate, centered on at least some of the unsupported regions. The edge clamp also includes first fixing means coupled to the elongated first spring element and to the fixed flat structure for preventing motion of the elongated first spring element in, or parallel with, the first and second directions, and for allowing motion of the externally-directed projections in a third direction generally orthogonal to both the first and second directions. An elongated first wedging element is elongated in the first direction, and juxtaposed with the second spring plate of the elongated spring element. That surface of the first wedging element facing the second spring plate bears a plurality of wedges, having length dimensions parallel with the first direction which are approximately equal to the spacing between the supports. Each of the wedges also has height dimensions parallel with the third direction, the height of each of the wedges varying from a first value to a second value along the lengths thereof. The edge clamp also includes second fixing means coupled to the elongated first wedging element, for preventing motion of the elongated first wedging element as a whole in the third direction, and for allowing bidirectional motion of the first wedging element parallel to the first direction. Force application means are coupled to the first wedging element, for applying force to the first wedging element parallel to the first direction, for thereby causing motion of the first wedging element in a direction parallel with the first direction to thereby move each of the wedges relative to the externally directed projections of the second spring element to cause motion of the externally directed projections of the second spring element in the third direction relative to the fixed flat plate. As a result, or whereby, the externally directed projections of the first spring plate are urged against the elongated edge of the first flat plate.

In a preferred embodiment of the edge clamp according to the above aspect of the invention, the second fixing means comprises a second flat plate defining an elongated edge, and a second fixed flat structure. The elongated edge of the second flat plate extends parallel with the first direction and is juxtaposed with the second fixed flat structure. A second elongated spring element includes third and fourth generally mutually parallel spring plates. The third and fourth spring plates are elongated in the first direction. The third and fourth spring plates are mechanically interconnected by a plurality of spaced-apart second supports extending parallel with the second direction, to define between the second supports a plurality of unsupported regions in which the third and fourth spring plates are not interconnected, and to also define external surfaces of the third and fourth spring plates on those sides of the third and fourth spring plates remote from the second supports. The third spring plate defines at least a first externally-directed projection from the external surface of the first spring plate in regions overlying at least some of the unsupported regions, and the fourth spring plate defines at least a first externally-directed projection from the external surface of the second spring plate, centered on at least some of the unsupported regions. The elongated second spring element is adjacent the elongated edge of the second flat plate in a manner symmetrical with the disposition of the first spring element relative to the edge of the first flat plate. An elongated second wedging element is provided. The second wedging element is elongated in the first direction and is fixed to the first wedging element for motion therewith parallel with the first direction, and is juxtaposed with the fourth spring plate of the second spring element. That surface of the second wedging element facing the fourth spring plate bears a plurality of wedges having length dimensions parallel with the first direction which are approximately equal to the spacing between the second supports, and height dimensions parallel with the third direction. The height of each of the wedges varies from a first value to a second value. The wedges of the second wedging element and the projections of the fourth spring element are equal in dimensions, and registered with, the dimensions of those of the first wedging element and the first spring element. This produces equal and oppositely directed forces on the conjoined first and second wedging means when the forcing means moves the conjoined first wedging means and second wedging means relative to the first and second spring elements, respectively.

BRIEF DESCRIPTION OF THE DRAWING

FIG. 7a is a simplified end view of a portion of the structure of FIG. 1, and FIG. 7b is a simplified perspective or isometric view of a portion of a supporting cold plate, showing its elongated thermal transfer surfaces.

DESCRIPTION OF THE INVENTION

Figure 1:
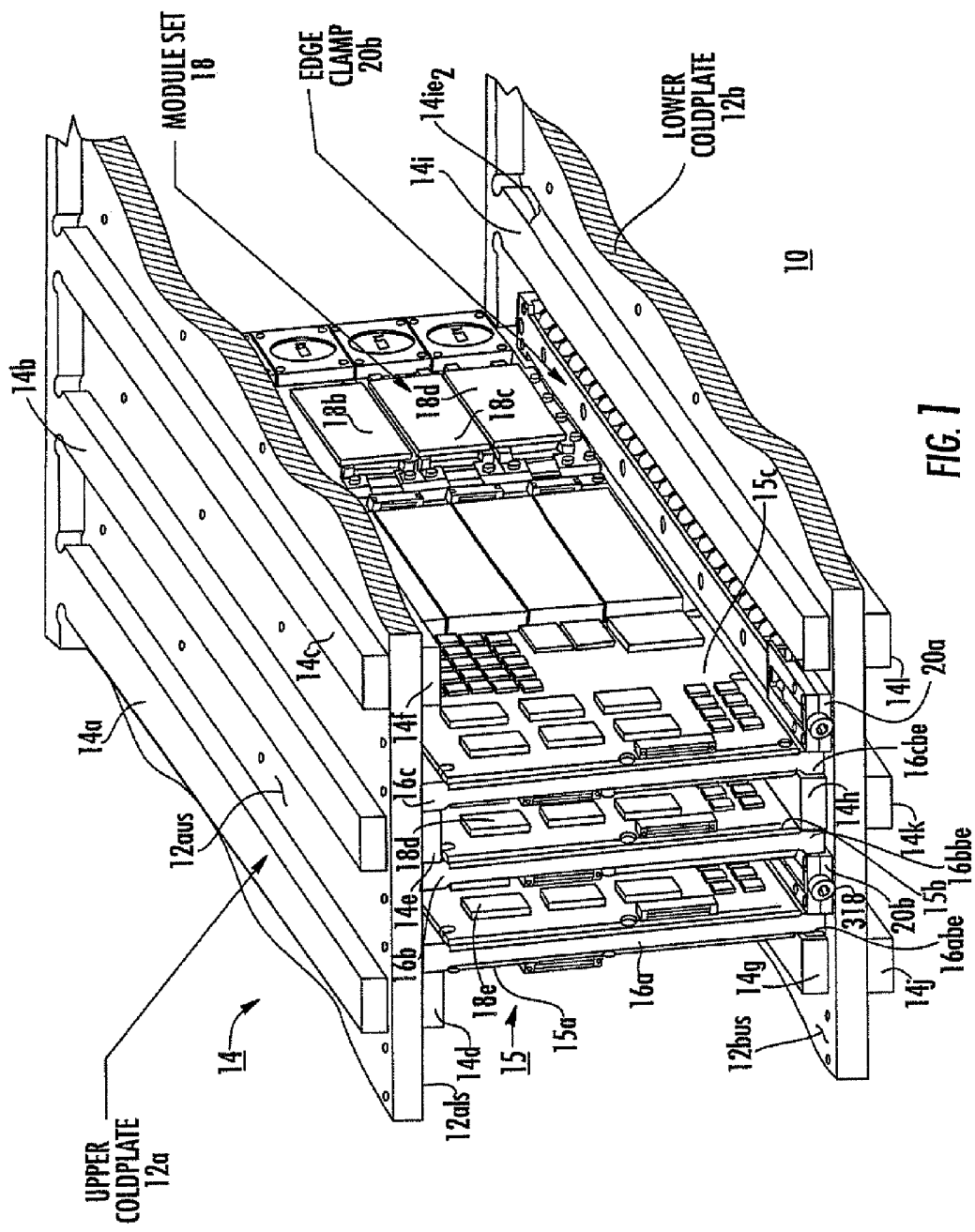
FIG. 1 is a simplified perspective or isometric view of a portion of a housing for removable line replaceable units including heat-generating modules, a cold plate, and elongated edge clamps according to an aspect of the invention.

In structure 10 of FIG. 1, a plurality (in this case two) of cold plates is illustrated. The two illustrated cold plates are an upper cold plate 12a and a mutually parallel lower cold plate 12b. The terms "upper" and "lower" and other derivative terms are meant only as an aid to the reader in identifying or locating the items in the FIGURES, and are not meant to indicate the orientation of the items in space. Cold plates 12a and 12b are illustrated as being solid thermally conductive plates, but they may contain channels for the flow of coolant fluid, if desired. As illustrated in FIG. 1, a plurality or set 14 of elongated bosses 14a, 14b, 14c are affixed to or integral with the upper surface 12aus of upper coldplate 12a. Similarly, a plurality of elongated bosses 14d, 14e, and 14f are located on the lower surface 12als of upper coldplate 12a, and registered with the bosses 14a, 14b, and 14c, respectively. A plurality of elongated bosses 14g, 14h, 14i are affixed to or integral with the upper surface 12bus of lower coldplate 12b. Similarly, a plurality of elongated bosses 14j, 14k, and 14l are located on the lower surface 12bls of lower coldplate 12b, and registered with the bosses 14g, 14h, and 14i, respectively. The locations of bosses 14g, 14h, and 14i of lower cold plate 12b are also registered with bosses 14d, 14e, and 14f of upper coldplate 12a. The bosses of set 14 of FIG. 1 may or may not contain channels for the flow of coolant fluid, but may be considered to be part of the cold plate.

Also illustrated in FIG. 1 are three line replaceable units (LRUs) 15a, 15b, and 15c of a set 15 of line replaceable units. Not all the line replaceable units are illustrated in FIG. 1. Each line replaceable unit of set 15 is associated with a generally planar supporting cold plate. More particularly, supporting cold plate 16a is associated with line replaceable unit 15a, supporting cold plate 16b is associated with line replaceable unit 15b, and supporting cold plate 16c is associated with line replaceable unit 15c. Heat-producing electrical or electronic elements or modules are mounted on each supporting cold plate of set 15 of line replaceable units. As illustrated in FIG. 1, the heat-producing elements associated with supporting cold plate 16c of line replaceable unit 15c include a set 18 of modules including modules 18b, 18c, and 18d. Other heat-producing modules are illustrated as being mounted on supporting cold plate 16c but are not separately designated. While most of the heat-producing modules associated with the supporting cold plates 16a and 16b of line replaceable units 15a and 15b are not visible in FIG. 1, heat-producing module 18d is illustrated as being mounted on cold plate 16b, and a heat-producing module 18e is illustrated as being mounted on supporting cold plate 16a.

According to an aspect of the invention, the heat transferred from the heat-producing modules of set 18 of modules of each of the line replaceable units 15a, 15b, and 15c of set 15 is transferred principally from an edge portion of the associated supporting cold plates 16a, 16b, and 16c to the adjacent boss of set 14 of bosses. In FIG. 1, heat coupled into supporting cold plate 16a of line replaceable unit 15a is coupled principally to one side of boss 14g through a bottom edge portion 16abe of supporting cold plate 16a, heat coupled into supporting cold plate 16b of line replaceable unit 15b is coupled principally to one side of boss 14h through a bottom edge portion 16bbe of supporting cold plate 16b, and heat coupled into supporting cold plate 16c of line replaceable unit 15c is coupled principally to the other side of boss 14h through a bottom edge portion 16cbe of supporting cold plate 16c. While not explicitly designated, corresponding heat flows occur between an upper edge portion of supporting cold plate 16a and one side of boss 14d, between an upper edge portion of supporting cold plate 16b and one side of boss 14e, and between an upper edge portion of supporting cold plate 16c and the other side of boss 14e. Thus, heat is extracted or flows from the upper and lower edge portions of supporting cold plates 16a, 16b, and 16d, and by extension from the corresponding edges of other cold plates, to the various bosses of set 14 of bosses affixed to, or integral with, cold plates 12a and 12b, and by extension to other cold plates (not illustrated) located above cold plate 12a and below cold plate 12b.

The line replaceable units 15a, 15b, and 15c of set 15 of line replaceable units of FIG. 1, and other like line replaceable units (not illustrated), can be inserted into or removed from the array of set 15 of line replaceable units simply by grasping the exposed edge of the line replaceable units and pulling the line replaceable unit so grasped from the array. As known in the art, push-type connectors or couplings (not illustrated) at the other or remote end of the line replaceable unit can make or break the desired electrical connections between the modules of each line replaceable unit and the outside world (regions on the far side of structure 10 in FIG. 1).

According to an aspect of the invention, a set 20 of elongated edge clamps, each of which can be actuated from the near side of the structure 10 of FIG. 1, is used to provide a relatively even clamping pressure between the edge portions of the supporting cold plates 16a, 16b, and 16c of line replaceable units 15a, 15b, and 15c and the relevant surfaces of adjacent bosses 14g and 14h. Two such elongated clamps of set 20 are illustrated in FIG. 1. A first elongated clamp of set 20 is illustrated as 20a, and a second elongated clamp of set 20 is illustrated as 20b.

Figure 2A:
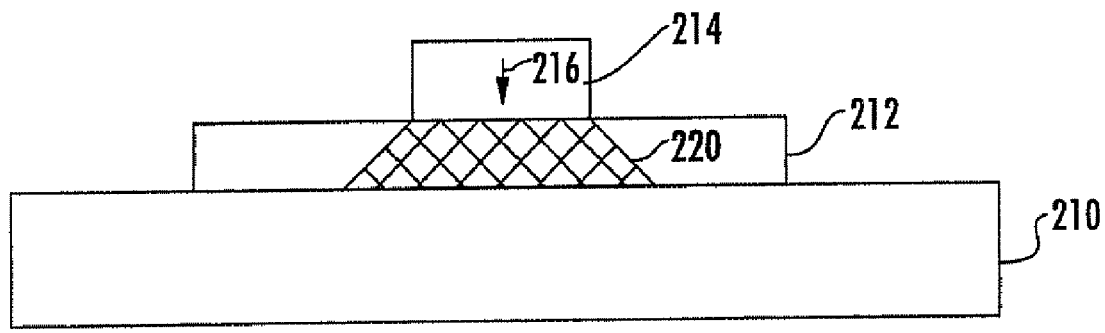
FIG. 2a illustrates the pressure distribution in a rigid body under load when supported by a ground.

FIG. 2a illustrates a planar ground or support surface 210 on which a rectangular rigid body 212 lies. An applied load is illustrated by block 214, and the direction of the imparted force is indicated by an arrow 216. The hatched region 220 illustrates the approximate pressure distribution in the rigid body 212 as a result of the applied load. The remainder of the rigid body does not spread the load and may be viewed as being wasted material. As can be seen, the pressure distribution is not constant, and lies mainly under the applied load.

Figure 2B:
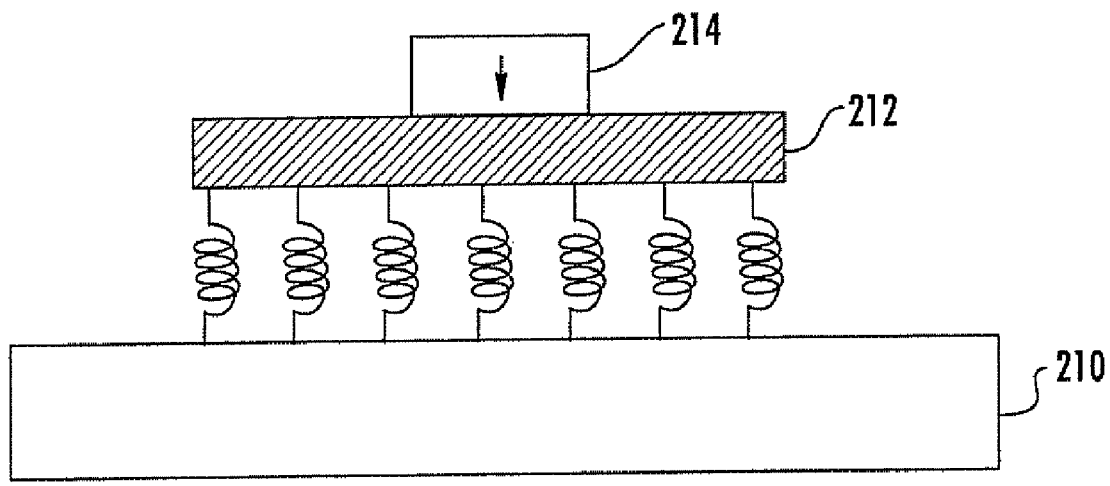
FIG. 2b illustrates the pressure distribution in the rigid body when supported by distributed spring elements.

FIG. 2b illustrates an arrangement in which the load can be more evenly distributed between the rigid body and the ground. In FIG. 2b, a set 216 of springs lies between rigid body 212 and ground 210. If the stiffness of each spring of set 216 is small relative to the stiffness of rigid body 212, the deflection of each spring will be substantially equal to the deflection of every other spring. Since the force exerted by a spring in its elastic range is linearly proportional to the deflection, the resulting load on the ground is virtually identical at each spring location. When the number of springs lying between the rigid body and the ground is large, and the interspring spacing equal and relatively small, the resulting localized or point forces on the ground 210 resembles or approximates a uniform pressure. The principles on which the edge clamps of FIG. 1 are based are similar.

Figure 3:
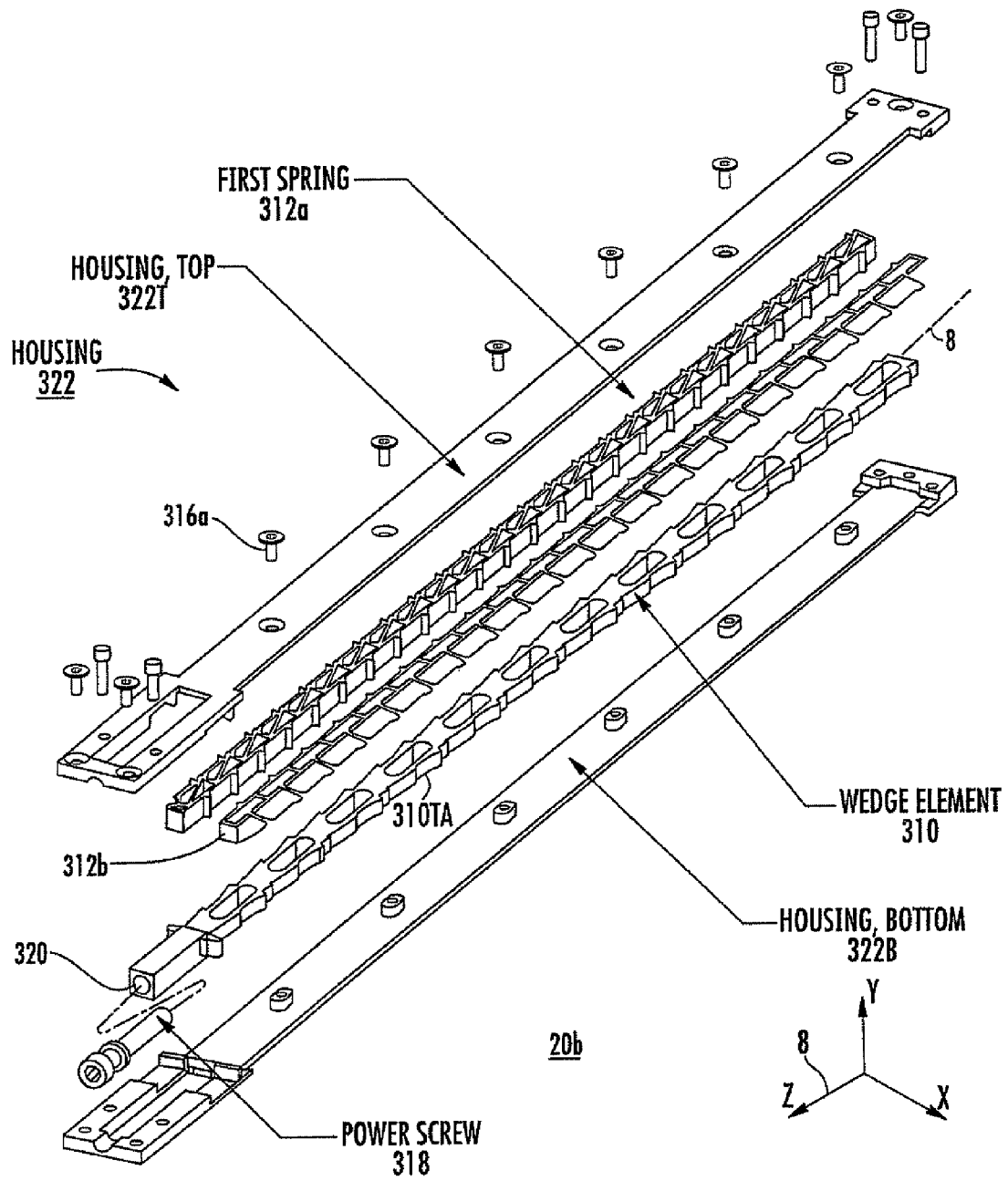
FIG. 3 is a simplified, exploded perspective or isometric diagram illustrating an edge clamp according to an aspect of the invention.

Most of clamp 20a is not visible in FIG. 1, so clamp 20b is deemed to be representative and is described in detail. Edge clamp 20b of FIG. 1 is illustrated in exploded view and more detail in FIG. 3. In FIG. 3, the edge clamp 20b can be seen to include a wedge element 310 elongated in a direction 8, corresponding to a z axis. A first spring element 312a and a second spring element 312b are operated on by the various individual wedges of wedge element 310 when the wedge element is moved axially, in the direction 8 of elongation. A pair of upper and lower housings 322T and 322B, respectively, held together by screws, one of which is designated 316a, prevent motion of wedge element 310 and spring elements 312a and 312b in the x and y directions, while allowing motion in the z direction, parallel to axis 8, under the influence of a captivated power screw 318 engaging a threaded aperture 320 in the near end of wedge element 310.

Figure 4A:
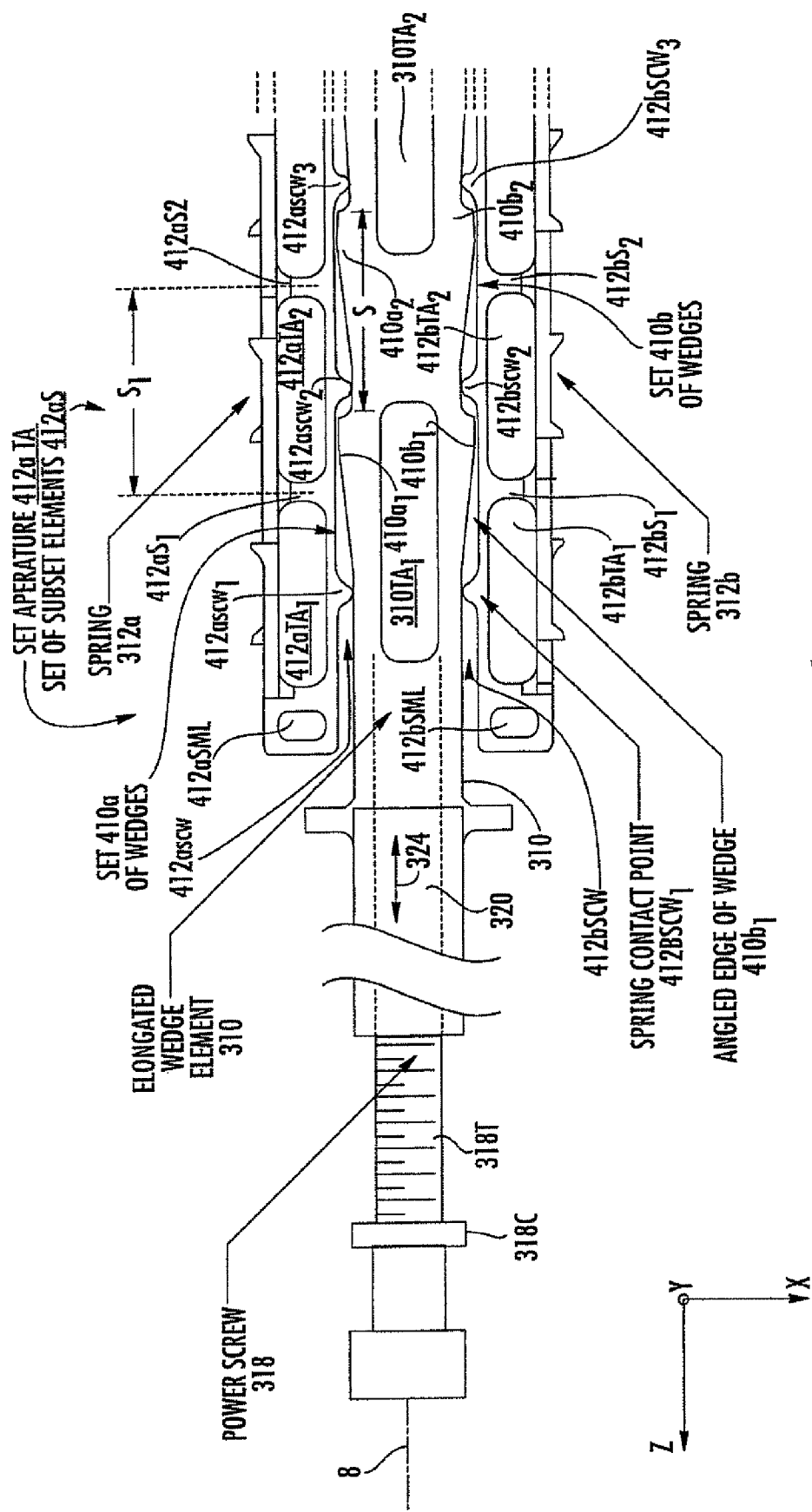
FIGS. 4a and 4b together illustrate the edge clamp of FIG. 3 in plan view, without its covers, showing the relationship between the elongated spring elements and elongated wedge element in a stowed state of the edge clamp.
Figure 4B:
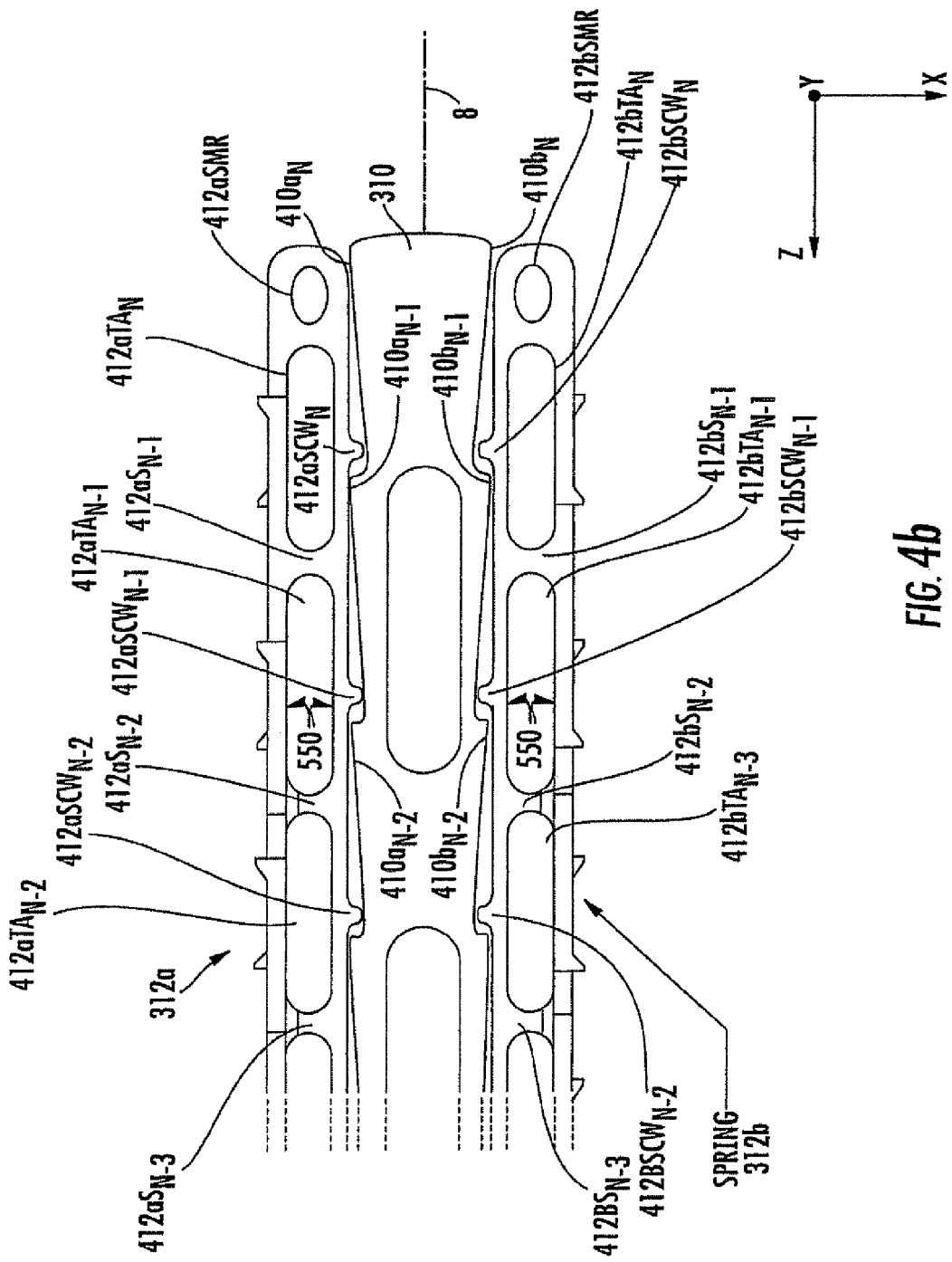

FIGS. 4a and 4b together illustrate the relationship between the spring elements 312a and 312b and the wedge element 310 of the edge clamp of FIG. 3 in a stowed state of the edge clamp. The positions of the elongated springs 312a and 312b are fixed. In FIGS. 4a and 4b, the power screw 318 is captivated by means (not illustrated in FIGS. 4a and 4b) and is in a state which is relatively disengaged from the threaded aperture 320 in the end of wedge element 310. Since the screw 318 is captive, this means that the wedge element 310 is in its right-most position relative to the spring elements 312a and 312b. As is illustrated in FIGS. 4a and 4b, both the elongated wedge element 310 and the elongated spring elements 312a and 312b include repeating, identical sections with a repetition spacing or pitch designated S.

In FIGS. 4a and 4b, the power screw 318 includes a threaded portion 318T and a collar 318C which coacts with a pair of shoulders of the edge clamp housing (not illustrated in FIGS. 4a and 4b) to restrain the power screw from substantial axial movement in the direction 8 of elongation. A portion of the threads 318T of power screw 318 engages the threaded bore 320 at the left end of wedge element 310. The elongated portion of wedge element 310 also defines a plurality of elongated or oval through apertures 310TA, which provide clearance for screws for mounting the upper 322T and lower 322B portions of the housing 322, as illustrated in FIGS. 3 and 4a, thereby allowing for axial motion of the wedge element 310 in the direction 8 of elongation, indicated by double-headed arrow 324. Those surfaces of elongated wedge element 310 which face elongated springs 312a and 312b define a plurality or sets 410a and 410b, respectively, of individual wedges. Set 410a of wedges includes individual wedges $410a_1, 410a_2, \ldots, 410a_{N-2}, 410a_{N-1}$, and $410a_N$, each of which is separated from the next by the pitch distance $S_1$, and each of which has a length dimension $S_2$ which is approximately equal to $S_1$. Similarly, set 410b of wedges includes individual wedges $410b_1, 410b_2, \ldots, 410b_{N-2}, 410b_{N-1}$, and $410b_N$, each of which is separated from the next by the pitch distance S. At any fixed transverse position at which a wedge of a set 410a or 410b exists, axial motion of the elongated wedge element 310 causes a surface or angled edge of the wedge to "move" toward or away from the axis 8 of elongation. Rotation of the power screw 318 to engage more or less of threaded portion 318T in the threaded aperture in the left end of elongated wedge element 310 (as seen in FIG. 4a) moves the elongated wedge element 310 to the left or right, respectively.

Also in FIGS. 4a and 4b, the fixed-location elongated spring elements 312a and 312b define sets 412aTA and 412bTA of elongated through apertures. More particularly, spring element 312a defines through apertures $412aTA_1$, $412aTA_2, \ldots, 412aTA_{N-2}, 412aTA_{N-1}, 412aTA_N$, and spring element 312b defines through apertures $412bTA_1$, $412bTA_2, \ldots, 412bTA_{N-2}, 412bTA_{N-1}$, and $412bTA_N$. The sets 412aTA and 412bTA of through apertures together define support elements lying between the through apertures. More particularly, set 412aTA of through apertures defines a set 412aS of support elements $412aS_1, 412aS_2, \ldots, 412aS_{N-3}, 412aS_{N-2}$, and $412aS_{N-1}$. Similarly, set 412bTA of through apertures defines a set 412bS of support elements $412bS_1, 412bS_2, \ldots, 412bS_{N-3}, 412bS_{N-2}$, and $412bS_{N-1}$. These supports of sets 412aS and 412bS are defined by apertures extending in the direction of the Y axis, and therefore extend in the Y direction, orthogonal to the z and x axes. The apertures of sets 412aTA and 412bTA are not clearance apertures for screws, but instead aid in defining the individual spring elements or beams of the elongated spring elements 312a and 312b in the regions lying between the supports of sets 412aS and 412bS. Mounting screw clearance apertures 412aSML and 412bSML allow the left ends of elongated spring elements 312a and 312b to be fixed to the housing 322 (FIG. 3) so that it remains immobile during motion of the elongated wedging element 310. Corresponding screw clearance apertures at the right are apertures 412aSMR and 412bSMR.

FIGS. 4a and 4b also illustrate sets 412aSCW and 412bSCW of spring contact projections or points extending from those surfaces of elongated spring elements 312a and 312b, respectively, facing the elongated wedging element 310. Individual More particularly, spring contact points associated with elongated spring element 312a include $412aSCW_1, 412aSCW_2, 412aSCW_3, \ldots, 412aSCW_{N-2}, 412aSCW_{N-1}$, and $412aSCW_N$. Spring contact points associated with elongated spring element 312b include $412bSCW_1, 412bSCW_2, 412bSCW_3, \ldots, 412bSCW_{N-2}, 412bSCW_{N-1}$, and $412bSCW_N$. The spring contact points associated with sets 412aSCW and 412bSCW of spring contact points are located at or near the center of the associated through aperture of sets 412aTA and 412bTA, respectively. More particularly, spring contact points $412aSCW_1, 412aSCW_2, 412aSCW_3, \ldots, 412aSCW_{N-2}, 412aSCW_{N-1}$, and $412aSCW_N$ of elongated spring element 312a are located near the centers of through apertures $412aTA_1, 412aTA_2, \ldots, 412aTA_{N-2}, 412aTA_{N-1}$, and $412aTA_N$, and spring contact points $412bSCW_1, 412bSCW_2, 412bSCW_3, \ldots, 412bSCW_{N-2}, 412bSCW_{N-1}$, and $412bSCW_N$ of spring element 312b are located near the centers of through apertures $412bTA_1, 412bTA_2, \ldots 412bTA_{N-2}, 412bTA_{N-1}$, and $412bTA_N$.

Figure 5:
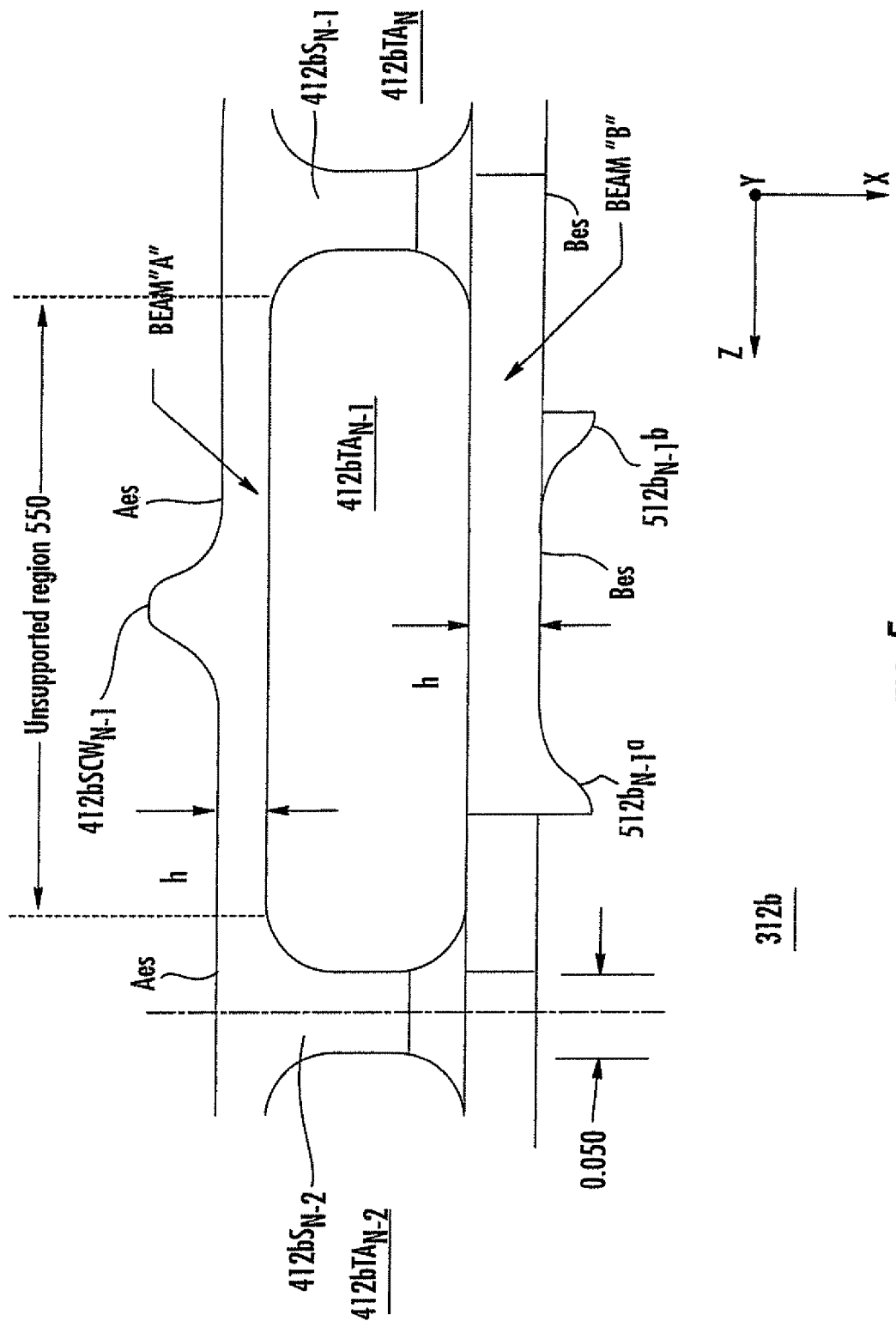
FIG. 5 is a plan view of one segment of an elongated spring element of FIG. 4b.

FIG. 5 is a plan view of a portion of the elongated spring of FIGS. 4a and 4b, illustrating one full segment or section of the spring element. For definiteness, the segment or section is that portion of elongated spring element 312b which is centered on through aperture $412bTA_{N-1}$, and which has adjacent supports $412bS_{N-1}$ and $412bS_{N-2}$. As illustrated in FIG. 5, two spring beams A and B are defined between the segment supports $412bS_{N-1}$ and $412bS_{N-2}$. As mentioned, the supports $412bS_{N-1}$ and $412bS_{N-2}$ extend vertically as illustrated in FIG. 5, which is to say in the y direction. Spring beam A is that one which faces the elongated wedging element 310, and spring beam B is that one which is remote from elongated wedging element 310, and which faces the surface to be clamped when in use. An exterior surface of beam A is that side Aes of beam A remote from the supports and beam B. An exterior surface of beam B is that side Bes of beam B remote from beam A and from the supports. Spring beam A has a thickness designated "h" in the unsupported region 550 away from projection or point 412bSCW$_{N-1}$. Spring beam B has a like thickness h in a location centered along the beam, and also has projections 512b$_{N-1}$a and 512b$_{N-1}$b extending in a direction away from spring beam A. Spring beam A acts as a simply supported beam with the load (the forces applied by the adjacent wedge face or surface) applied in its center. Beam B acts as a simply supported beam, with the load applied by projections 512b$_{N-1}$a and 512b$_{N-1}$b evenly distributed along its length.

The illustrations of FIGS. 4a and 4b, as mentioned, show the elongated edge clamp 20b in its stowed or retracted state, in which the inclined surfaces of the individual wedges contact the points on the A spring beams at locations which impart little or no force in a direction transverse to the direction 8 of elongation (in the x direction of the coordinate axes).

Figure 6A:
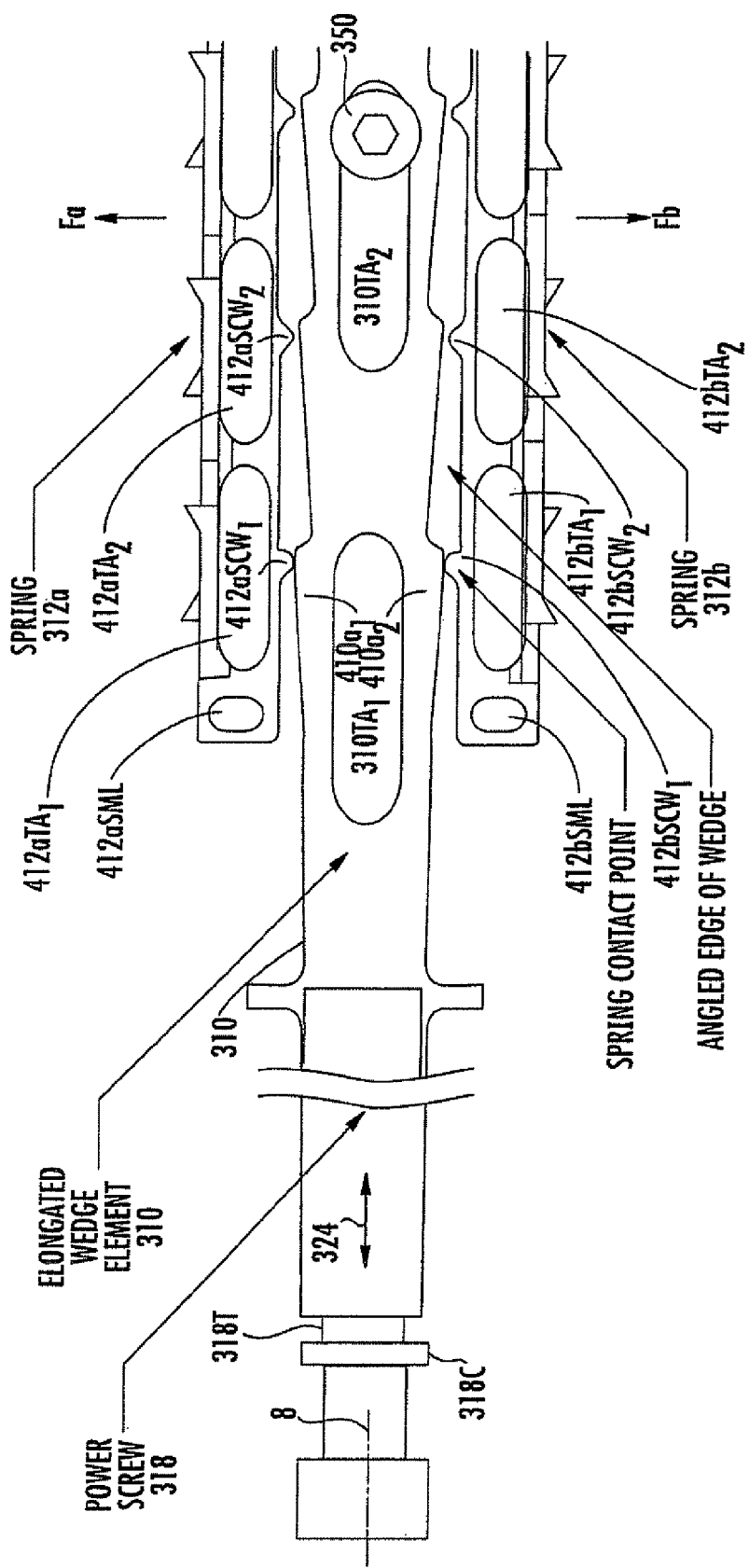
FIGS. 6a and 6b together illustrate the edge clamp of FIG. 3 in plan view, without covers, showing the relationship between the elongated spring elements and elongated wedge element in an extended state in which forces are imparted to the clamped structure.
Figure 6B:
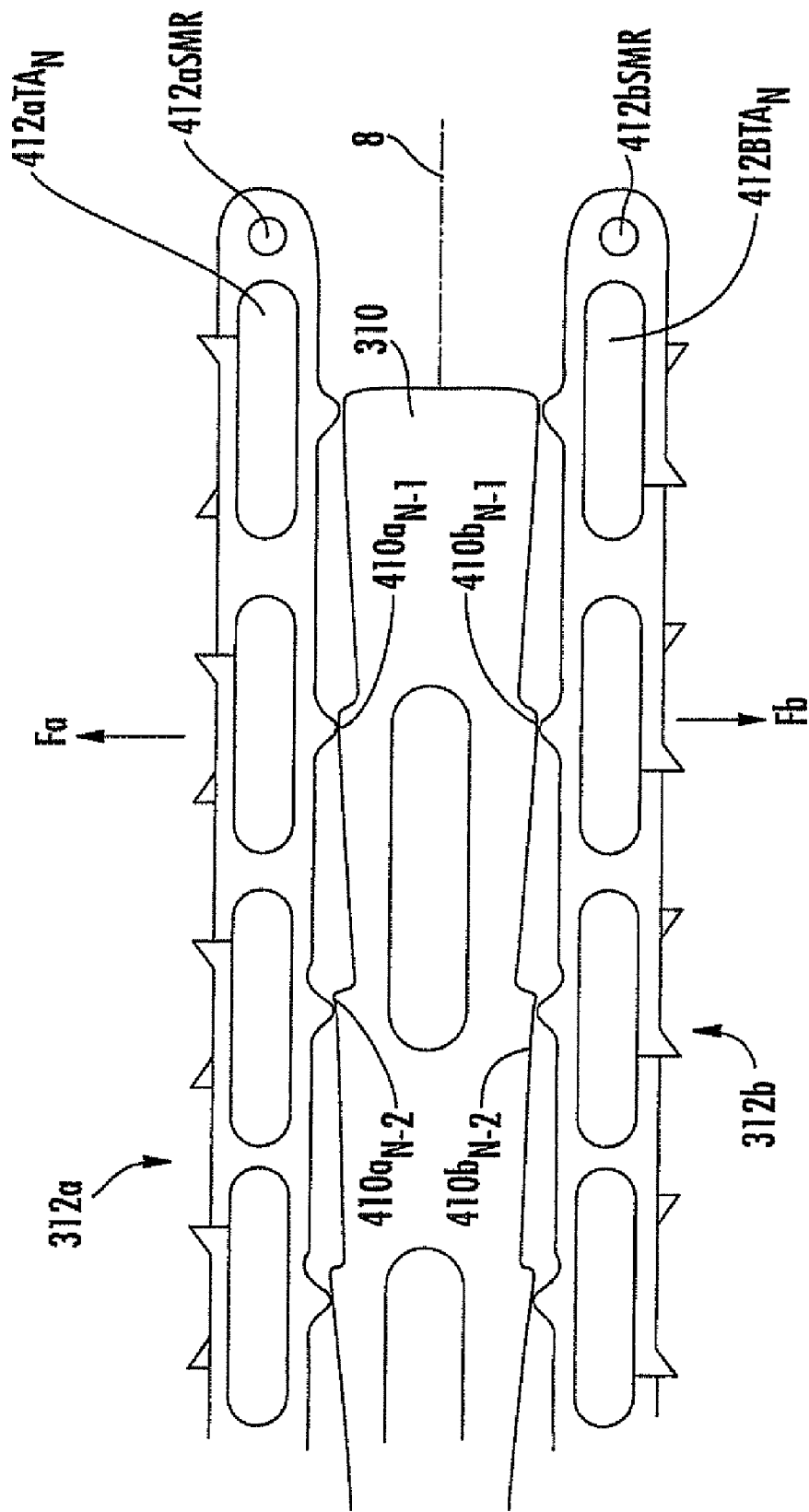

FIGS. 6a and 6b together illustrate elongated edge clamp 20b, without its covers and in its extended state, in which extended state forces Fa and Fb are applied transverse to the direction 8 of elongation of the edge clamp. Elements of the edge clamp of FIGS. 6a and 6b which correspond to those of FIGS. 4a and 4b are designated by like reference numerals. As illustrated in FIGS. 6a and 6b, the spring contact points make contact with that portion of the associated wedge having the greatest projection, or nearly the greatest projection, in the x direction, to thereby force the spring elements outward relative to the axis 8 of elongation. The spring projections of springs 312a and 312b bear on the adjacent generally flat edge portions 16bbe and 16cbe of the supporting cold plates 16b and 16c of line replaceable units 15b and 15c, respectively, as illustrated in the end elevation view of FIG. 7a.

In the end elevation view of FIG. 7a, a portion of structure 10 of FIG. 1 includes cold plate 12b with fixed structures or bosses 14g, 14h, and 14i affixed to its upper surface 12bus. Each boss 14g, 14h, and 14i is mounted on cold plate 12b as described in conjunction with FIG. 1, and has elongated thermal or heat transfer edges 14ge$_1$, 14ge$_2$, 14he$_1$, 14he$_2$, 14ie$_1$, and 14ie$_2$, respectively. As illustrated in FIG. 7b, supporting cold plate 16a includes a lower or bottom edge portion 16abe, and this lower edge portion defines elongated flat surfaces 16abe$_1$ and 16abe$_2$. As illustrated in FIG. 7a, the lower or bottom edge portion 16abe of supporting cold plate 16b of line replaceable unit 15a has one side 16abe$_1$ abutting heat transfer surface 14ge$_2$ of boss 14g, and its other side 16abe$_2$ abutting a long side of edge clamp 20a. Similarly, one side 16bbe$_2$ of the bottom edge portion 16bbe of supporting cold plate 16b of line replaceable unit 15b abuts an elongated side 14he$_1$ of boss 14h, and its other side 16bbe$_1$ abuts the other side of elongated edge clamp 20a. When power screw 318 of FIG. 7a is rotated in one direction, the wedges of edge clamp 20a (not visible in FIG. 7a) press outward from the edge clamp to force the adjacent bottom edge portion surfaces 16abe$_2$ and 16bbe$_1$ of supporting cold plates 16a and 16b away from edge clamp 20a, thereby tending to press or push the elongated thermal or heat transfer surfaces 16abe$_1$, 16bbe$_2$ of supporting cold plates 16a and 16b toward heat transfer surfaces 14ge$_2$ and 14he$_1$ of bosses 14g and 14h, respectively. The resulting pressure is distributed along the length of the edge clamp 20a by virtue of its spring action described in conjunction with FIGS. 4a, 4b, and 5. As illustrated in FIG. 7a, heat sources in the form of electronic modules 710a, 710b, and 710c may be physically mounted on supporting cold plates 16a and 16b, thermally coupled thereto by way of intermediary elements such as printed-circuit boards 712a, 712b, and 712c. For better thermal coupling, the heat-producing electronic modules, such as module 710d, may be mounted directly to the supporting cold plate 16b, as for example through an aperture 712dC in a printed-circuit board 712d, or in the absence of a printed circuit board. The distributed forces tend to hold the heat transfer surfaces of the supporting cold plates 16a and 16b in good thermal contact with the bosses 14g and 14h of the cold plate 12b, thereby tending to provide good heat transfer from the heat-producing elements to the ultimate heat sink.

It should be noted that the edge clamps, such as edge clamp 20a of FIG. 7a, may also provide some measure of heat sinking, since the edge clamps are juxtaposed to the heat sinks, such as heat sink 12b of FIG. 7a, and the edge clamps also have surface area exposed to the ambient air.

Those skilled in the art will recognize that the forces imparted by the elongated edge clamp as described in conjunction with FIGS. 1, 2a, 2b, 3, 4a, 4b, 5, 6a, 6b, 7a, and 7b are applied equally on either side of the edge clamp, and that these equal forces tend to render the edge clamp immobile, just as though it were fixed in the lateral or x direction. Those skilled in the art will recognize that the edge clamp can be rendered immobile in the x direction with only a single clamping side (that is, with only a single elongated spring element such as spring element 312a, and with only a single side of the wedging element having individual wedges) if the wedging element is constrained against lateral motion (motion in the x direction). Such a restraint is easily accomplished by placing mounting or fixing screws through the elongated through apertures in the wedging element 310. Such a mounting screw is illustrated as 350 of FIG. 6a, extending through aperture 310TA2.

A method according to another aspect of the invention is for clamping a generally planar object (16a) to a planar surface (14ge$_2$). The method includes juxtaposing the planar object (16a) to the planar surface (14ge$_2$). An elongated wedging element (310) including a plurality of wedges (410a) along its length is fixed against motion in directions (x,y) other than the direction (8) of elongation of the wedging element (310), and is forced to move axially in the direction (8) of elongation. Each of the wedges bears against a corresponding first spring beam in a direction (x) orthogonal to the direction (8) of elongation in response to the axial motion in the direction (8) of elongation of the wedging element (310), to thereby impart force to the first spring beam (A). The forces imparted to the first spring beam (A) are coupled by intermediary supports (412) to a second spring beam (B), and from the second spring beam (B) to the generally planar object (16a) to force the generally planar object (16a) into contact with the planar surface (14ge$_2$).

A method for extracting heat from a replaceable module (one of set 15) including a plate (16a) having a straight exposed edge (16abe1, 16abe2) region according to an aspect of the invention comprises the step of placing a first side (16ab$_1$) of the edge region adjacent a surface (14ge$_2$) of a fixed, generally planar cold plate (14g). A clamping element (20a) elongated in a direction (8) of elongation is placed between a second side (16abe$_2$) of the edge region (16abe) and a generally straight fixed object (16bbe$_1$). The clamping element (20a) includes an elongated spring element (312a) having protrusions (412b) spaced apart by a pitch distance (S$_1$), and also includes an elongated wedging element (310) including a plurality of individual wedges, also spaced apart by about the pitch distance (S$_2$). Each of the individual wedges is adjacent to at least one of the protrusions. The method includes moving the elongated wedging element (310) in a direction parallel to the direction (8) of elongation in such a manner as to cause a wedge surface of each of the wedges to move in a direction toward its associated protrusions (412b), whereby force is applied to force the spring element toward the second edge portion (16abe$_2$) of the plate (16a), and the first edge portion (16abe$_1$) of the plate (16a) is forced against the generally flat surface (14ge$_2$) of the fixed, generally planar cold plate (14g).

Thus, an edge clamp (20a) according to an aspect of the invention is for clamping an elongated edge of a first flat plate (16a) to a fixed flat structure (14g). The edge clamp (20a) comprises an elongated first spring element (312a) including first (B) and second (A) generally mutually parallel spring plates. The first (B) and second (A) spring plates are elongated in a first direction (8), namely the direction of elongation (8) of the elongated edge of the first flat plate (16a). The first (B) and second (A) spring plates are mechanically interconnected by a plurality of spaced-apart supports (412aS1, 412aS2, . . . ) extending in a second direction (y) generally orthogonal to the direction (8) of elongation of the first (B) and second (A) spring plates, to define between the supports (412aS1, 412aS2, . . . ) a plurality of unsupported regions (550) in which the first (B) and second (A) spring plates are not interconnected, and to also define external surfaces of the first (B) and second (A) spring plates on those sides of the first (B) and second (A) spring plates remote from the supports (412a81, 412aS2, . . . ). The first spring plate (B) defines at least a first, and preferably a second, externally-directed projection (512b, . . . ) from the external surface of the first spring plate (B) in regions overlying at least some of the unsupported regions (550), and the second spring plate (A) defines at least a first externally-directed projection (412b) from the external surface of the second spring plate (A), centered on at least some of the unsupported regions (550). The edge clamp (20a) also includes first fixing means (aperture 412aSML and screws) coupled to the elongated first spring element (312a) and to the fixed flat structure (14g) for preventing motion of the elongated first spring element (312a) in, or parallel with, the first (8) and second (y) directions, and for allowing motion of the externally-directed projections in a third (x) direction generally orthogonal to both the first (8) and second (y) directions. An elongated first wedging element (310) is elongated in the first direction (8), and juxtaposed with the second spring plate (A) of the elongated spring element (312a). That surface of the first wedging element (310) facing the second spring plate bears a plurality of wedges (410a1, 410a2, . . . ), having length dimensions (S$_2$) parallel with the first direction (8) which are approximately equal to the spacing (S$_1$) between the supports (412aS1, 412aS2, . . . ). Each of the wedges (410a1, 410a2, . . . ) also has height dimensions parallel with the third direction (x), the height of each of the wedges varying from a first value to a second value along the lengths thereof. The edge clamp (20a) also includes second fixing means (symmetry andor screws 350) coupled to the elongated first wedging element (310), for preventing motion of the elongated first wedging element (310) as a whole in the third (x) direction, and for allowing bidirectional motion of the first wedging element (310) parallel to the first (8) direction. Force application means (318) are coupled to the first wedging element (310), for applying force to the first wedging element (310) parallel to the first (8) direction, for thereby causing motion of the first wedging element (310) in a direction parallel with the first (8) direction to thereby move each of the wedges (410a1, 410a2, . . . ) relative to the externally directed projections (412b) of the second spring element (A) to cause motion of the externally directed projections (412b) of the second spring element (A) in the third (x) direction relative to the fixed flat plate (16a). As a result, or whereby, the externally directed projections (512b) of the first spring plate (B) are urged against the elongated edge (16abe$_2$) of the first flat plate (16a).

In a preferred embodiment of the edge clamp (20b) according to the above aspect of the invention, the second fixing means comprises a second flat plate (16b) defining an elongated edge (16bbe$_2$), and a second fixed flat structure (14h). The elongated edge (16bbe$_2$) of the second flat plate (16b) extends parallel with the first direction (8) and is juxtaposed with the second fixed flat structure (14h). A second elongated spring element (312a) includes third (B) and fourth (A) generally mutually parallel spring plates. The third (B) and fourth (A) spring plates are elongated in the first (8) direction. The third (B) and fourth (A) spring plates are mechanically interconnected by a plurality of spaced-apart second supports (412S) extending parallel with the second direction (y), to define between the second supports (412S) a plurality of unsupported regions (550) in which the third (B) and fourth (A) spring plates are not interconnected, and to also define external surfaces (Bes, Aes) of the third (B) and fourth (A) spring plates on those sides of the third (B) and fourth (A) spring plates remote from the second supports (412S). The third spring plate (B) defines at least a first externally-directed projection (512b) from the external surface (Bes) of the first spring plate (B) in regions overlying at least some of the unsupported regions (550), and the fourth spring plate (A) defines at least a first externally-directed projection (412b) from the external surface (Aes) of the second spring plate (A), centered on at least some of the unsupported regions (550). The elongated second spring element (312a) is adjacent the elongated edge (16bbe$_1$) of the second flat plate (16b) in a manner symmetrical with the disposition of the first spring element (312a) relative to the edge (16abe$_2$) of the first flat plate (16a). An elongated second wedging element (other side of 310, wedges 410b$_1$ . . . ) is provided. The second wedging element (other side of 310, wedges 410b$_1$ . . . ) is elongated in the first direction (8) and is fixed to the first wedging element (310) for motion therewith parallel with the first (8) direction, and is juxtaposed with the fourth (A) spring plate of the second spring element (312b). That surface of the second wedging element (other side of 310, wedges 410b$_1$ . . . ) facing the fourth (B) spring plate bears a plurality of wedges (410b$_1$, 410b$_2$, . . . ) having length dimensions (S$_2$) parallel with the first direction (8) which are approximately equal to the spacing (S$_1$) between the second supports, and height dimensions parallel with the third direction (x). The height of each of the wedges varies from a first value to a second value. The wedges of the second wedging element (other side of 310, wedges 410b$_1$, . . . ) and the projections (412) of the fourth spring element (A) are equal in dimensions, and registered with, the dimensions of those of the first wedging element (first side of 310, wedges 410a1, . . . ) and the first spring element. This produces equal and oppositely directed forces on the conjoined first and second wedging means when the forcing means moves the conjoined first wedging means and second wedging means relative to the first and second spring elements, respectively.

What is claimed is:

1. An edge clamp for clamping an elongated edge of a first flat plate to a fixed flat structure, said edge clamp comprising:
an elongated spring element including first and second generally mutually parallel spring plates, said first and second spring plates being elongated in a first direction, namely the direction of elongation of said elongated edge of said flat plate, said first and second spring plates being mechanically interconnected by a plurality of spaced-apart supports extending in a second direction generally orthogonal to said direction of elongation of said first and second spring elements, to define between said supports a plurality of unsupported regions in which said first and second spring plates are not interconnected, and to also define external surfaces of said first and second spring plates on those sides of said first and second spring plates remote from said supports, said first spring plate defining at least a first externally-directed projection from said external surface of said first spring plate in regions overlying at least some of said unsupported regions, and said second spring plate defining at least a first externally-directed projection from said external surface of said second spring plate, centered on at least some of said unsupported regions;

first fixing means coupled to said first spring element and to said fixed flat structure for preventing motion of said first spring element in said first and second directions, and for allowing motion of said externally-directed projections in a third direction generally orthogonal to both said first and second directions;

an elongated first wedging element, said first wedging element being elongated in said first direction, and being juxtaposed with said second spring plate of said spring element, that surface of said first wedging element facing said second spring plate bearing a plurality of wedges having length dimensions parallel with said first direction which are approximately equal to the spacing between said supports, and height dimensions parallel with said third direction, said height of each of said wedges varying from a first value to a second value along the length thereof;

second fixing means coupled to said elongated first wedging element, for preventing motion of said elongated first wedging element as a whole in said third direction, and allowing bidirectional motion of said first wedging element parallel to said first direction;

force application means coupled to said first wedging element, for applying force to said first wedging element parallel to said first direction, for thereby causing motion of said first wedging element in a direction parallel with said first direction to thereby move each of said wedges relative to said externally directed projections of said second spring element to cause motion of said externally directed projections of said second spring element in said third direction relative to said fixed plate, whereby said externally directed projections of said first spring plate are urged against said elongated edge of said first flat plate.

2. An edge clamp according to claim 1, wherein said second fixing means comprises:

a second flat plate defining an elongated edge, and a second fixed flat structure, said elongated edge of said second flat plate extending parallel with said first direction and being juxtaposed with said second fixed flat structure;

a second elongated spring element including third and fourth generally mutually parallel spring plates, said third and fourth spring plates being elongated in said first direction, said third and fourth spring plates being mechanically interconnected by a plurality of spaced-apart second supports extending parallel with said second direction, to define between said second supports a plurality of unsupported regions in which said third and fourth spring plates are not interconnected, and to also define external surfaces of said third and fourth spring plates on those sides of said third and fourth spring plates remote from said second supports, said third spring plate defining at least a first externally-directed projection from said external surface of said first spring plate in regions overlying at least some of said unsupported regions, and said fourth spring plate defining at least a first externally-directed projection from said external surface of said second spring plate, centered on at least some of said unsupported regions, said second spring element being adjacent said elongated edge of said second flat plate in a manner symmetrical with the disposition of said first spring element relative to said edge of said first flat plate;

an elongated second wedging element, said second wedging element being elongated in said first direction and being fixed to said first wedging element for motion therewith parallel with said first direction, and being juxtaposed with said fourth spring plate of said spring element, that surface of said second wedging element facing said fourth spring plate bearing a plurality of wedges having length dimensions parallel with said first direction which are approximately equal to the spacing between said second supports, and height dimensions parallel with said third direction, said height of each of said wedges varying from a first value to a second value, said wedges of said second wedging element and said projections of said second spring element being equal in dimensions and registered with those of said first wedging element and said first spring element to thereby produce equal and oppositely directed forces on said conjoined first and second wedging means when said forcing means moves said first wedging means and conjoined second wedging means relative to said first and second spring elements, respectively.

3. An edge clamp for clamping edges of plates to fixed structures, said edge clamp comprising:

a spring element including first and second spring plates interconnected by a plurality of spaced-apart supports extending between said first and second spring elements, said first spring plate defining at least one externally-directed projection and said second spring plate defining at least one externally-directed projection;

a wedging element including a surface facing said second spring plate, said surface including a plurality of wedges, each of said wedges being of a variable height; and a force applicator for moving said wedging element to thereby urged said at least one externally directed projection of said first spring plate against a first one of said edges of a corresponding first one of said plates.

4. An edge clamp according to claim 3, wherein the spring element is a first spring element and further comprising:

a second spring element including first and second spring plates interconnected by a plurality of spaced-apart supports extending between said first and second spring elements, said first spring plate defining at least one externally-directed projection and said second spring plate defining at least one externally-directed projection, wherein said surface of said wedging element is a first surface and wherein said wedging element further includes a second surface facing said second spring plate of said second spring element, said second surface including a plurality of wedges, each of said wedges being of a variable height; and wherein said force applicator is also for moving said wedging element to thereby urged said at least one externally directed projection of said first spring plate of said second spring element against a second one of said edges of a corresponding second one of said plates.

* * * * *